(12) United States Patent
Lin et al.

(10) Patent No.: US 8,962,481 B2
(45) Date of Patent: Feb. 24, 2015

(54) CHIP-ON-WAFER STRUCTURES AND METHODS FOR FORMING THE SAME

(71) Applicant: Taiwan Semiconductor Manufacturing Company, Ltd., Hsin-Chu (TW)

(72) Inventors: Jin-Cheng Lin, Chu Tung Zhen (TW); Hsin Chang, Hsinchu City (TW); Shih Ting Lin, Taipei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/157,666

(22) Filed: Jan. 17, 2014

(65) Prior Publication Data

US 2014/0134802 A1 May 15, 2014

Related U.S. Application Data

(62) Division of application No. 13/397,204, filed on Feb. 15, 2012, now Pat. No. 8,643,148.

(60) Provisional application No. 61/565,346, filed on Nov. 30, 2011.

(51) Int. Cl.
*H01L 21/78* (2006.01)
*H01L 23/498* (2006.01)
(Continued)

(52) U.S. Cl.
CPC .......... *H01L 21/78* (2013.01); *H01L 23/49827* (2013.01); *H01L 25/0652* (2013.01); *H01L 25/50* (2013.01); *H01L 21/6835* (2013.01); *H01L 23/147* (2013.01); *H01L 21/486* (2013.01); *H01L 23/3128* (2013.01); *H01L 21/561* (2013.01); *H01L 21/568* (2013.01);

*H01L 24/97* (2013.01); *H01L 2224/16145* (2013.01); *H01L 2224/16225* (2013.01); *H01L 2224/32145* (2013.01); *H01L 2224/32225* (2013.01); *H01L 2224/73204* (2013.01); *H01L 2224/97* (2013.01);
(Continued)

(58) Field of Classification Search
USPC .......................................... 438/113, 666, 667
See application file for complete search history.

(56) References Cited

U.S. PATENT DOCUMENTS

| 4,811,082 A | 3/1989 | Jacobs et al. |
| 4,990,462 A | 2/1991 | Sliwa, Jr. |

(Continued)

FOREIGN PATENT DOCUMENTS

| JP | 2001035865 | 2/2001 |
| JP | 2001036098 | 2/2001 |

(Continued)

*Primary Examiner* — Thao P Le
(74) *Attorney, Agent, or Firm* — Slater & Matsil, L.L.P.

(57) ABSTRACT

A package component includes a substrate, wherein the substrate has a front surface and a back surface over the front surface. A through-via penetrates through the substrate. A conductive feature is disposed over the back surface of the substrate and electrically coupled to the through-via. A first dielectric pattern forms a ring covering edge portions of the conductive feature. An Under-Bump-Metallurgy (UBM) is disposed over and in contact with a center portion of the conductive feature. A polymer contacts a sidewall of the substrate. A second dielectric pattern is disposed over and aligned to the polymer. The first and the second dielectric patterns are formed of a same dielectric material, and are disposed at substantially a same level.

20 Claims, 14 Drawing Sheets

(51) Int. Cl.
*H01L 25/065* (2006.01)
*H01L 25/00* (2006.01)
*H01L 21/683* (2006.01)
*H01L 23/14* (2006.01)
*H01L 21/48* (2006.01)
*H01L 23/31* (2006.01)
*H01L 21/56* (2006.01)
*H01L 23/00* (2006.01)

(52) U.S. Cl.
CPC . *H01L 2924/15311* (2013.01); *H01L 2924/157* (2013.01); *H01L 2924/18161* (2013.01); *H01L 25/0655* (2013.01); *H01L 2225/06513* (2013.01); *H01L 2225/06541* (2013.01); *H01L 24/16* (2013.01); *H01L 2221/68345* (2013.01); *H01L 2224/13147* (2013.01); *H01L 2224/13655* (2013.01); *H01L 2224/81192* (2013.01); *H01L 2224/81447* (2013.01); *H01L 2224/81455* (2013.01); *H01L 23/49816* (2013.01); *H01L 2224/131* (2013.01); *H01L 2224/16227* (2013.01); *H01L 2224/94* (2013.01)
USPC .......................................... 438/667; 438/113

(56) References Cited

U.S. PATENT DOCUMENTS

| | | | |
|---|---|---|---|
| 5,075,253 | A | 12/1991 | Sliwa, Jr. |
| 5,380,681 | A | 1/1995 | Hsu |
| 5,481,133 | A | 1/1996 | Hsu |
| 6,002,177 | A | 12/1999 | Gaynes et al. |
| 6,187,678 | B1 | 2/2001 | Gaynes et al. |
| 6,229,216 | B1 | 5/2001 | Ma et al. |
| 6,236,115 | B1 | 5/2001 | Gaynes et al. |
| 6,271,059 | B1 | 8/2001 | Bertin et al. |
| 6,279,815 | B1 | 8/2001 | Correia et al. |
| 6,355,501 | B1 | 3/2002 | Fung et al. |
| 6,434,016 | B2 | 8/2002 | Zeng et al. |
| 6,448,661 | B1 | 9/2002 | Kim et al. |
| 6,461,895 | B1 | 10/2002 | Liang et al. |
| 6,562,653 | B1 | 5/2003 | Ma et al. |
| 6,570,248 | B1 | 5/2003 | Ahn et al. |
| 6,600,222 | B1 | 7/2003 | Levardo |
| 6,603,191 | B2 | 8/2003 | Wakabayashi et al. |
| 6,607,938 | B2 | 8/2003 | Kwon et al. |
| 6,661,085 | B2 | 12/2003 | Kellar et al. |
| 6,762,076 | B2 | 7/2004 | Kim et al. |
| 6,790,748 | B2 | 9/2004 | Kim et al. |
| 6,908,565 | B2 | 6/2005 | Kim et al. |
| 6,908,785 | B2 | 6/2005 | Kim |
| 6,924,551 | B2 | 8/2005 | Rumer et al. |
| 6,943,067 | B2 | 9/2005 | Greenlaw |
| 6,946,384 | B2 | 9/2005 | Kloster et al. |
| 6,975,016 | B2 | 12/2005 | Kellar et al. |
| 7,037,804 | B2 | 5/2006 | Kellar et al. |
| 7,056,807 | B2 | 6/2006 | Kellar et al. |
| 7,087,538 | B2 | 8/2006 | Staines et al. |
| 7,151,009 | B2 | 12/2006 | Kim et al. |
| 7,157,787 | B2 | 1/2007 | Kim et al. |
| 7,215,033 | B2 | 5/2007 | Lee et al. |
| 7,276,799 | B2 | 10/2007 | Lee et al. |
| 7,279,795 | B2 | 10/2007 | Periaman et al. |
| 7,307,005 | B2 | 12/2007 | Kobrinsky et al. |
| 7,317,256 | B2 | 1/2008 | Williams et al. |
| 7,320,928 | B2 | 1/2008 | Kloster et al. |
| 7,345,350 | B2 | 3/2008 | Sinha |
| 7,402,442 | B2 | 7/2008 | Condorelli et al. |
| 7,402,515 | B2 | 7/2008 | Arana et al. |
| 7,410,884 | B2 | 8/2008 | Ramanathan et al. |
| 7,432,592 | B2 | 10/2008 | Shi et al. |
| 7,494,845 | B2 | 2/2009 | Hwang et al. |
| 7,528,494 | B2 | 5/2009 | Furukawa et al. |
| 7,531,890 | B2 | 5/2009 | Kim |
| 7,557,597 | B2 | 7/2009 | Anderson et al. |
| 7,576,435 | B2 | 8/2009 | Chao |
| 7,834,450 | B2 | 11/2010 | Kang |
| 8,399,963 | B2 | 3/2013 | Tsai et al. |
| 8,580,683 | B2 * | 11/2013 | Wang et al. ................ 438/667 |
| 8,618,651 | B1 * | 12/2013 | Yee ................ 257/698 |
| 2003/0147227 | A1 | 8/2003 | Egitto et al. |
| 2006/0281309 | A1 * | 12/2006 | Trezza ................ 438/675 |
| 2009/0302448 | A1 | 12/2009 | Huang |
| 2012/0018876 | A1 | 1/2012 | Wu et al. |
| 2012/0146153 | A1 * | 6/2012 | Wen et al. ................ 257/368 |
| 2013/0221493 | A1 | 8/2013 | KIM et al. |
| 2014/0151895 | A1 * | 6/2014 | West et al. ................ 257/774 |

FOREIGN PATENT DOCUMENTS

| | | |
|---|---|---|
| JP | 2004128497 | 4/2004 |
| KR | 20060111305 | 10/2006 |
| TW | 201015687 | 4/2010 |

* cited by examiner

CHIP-ON-WAFER STRUCTURES AND METHODS FOR FORMING THE SAME

This application is a divisional of U.S. patent application Ser. No. 13/397,204, entitled "Chip-on-Wafer Structures and Methods for Forming the Same," filed on Feb. 15, 2012, which application claims the benefit of the following provisionally filed U.S. Patent Application Ser. No. 61/565,346, filed Nov. 30, 2011, and entitled "Chip-on-Wafer Structures and Methods for Forming the Same," which applications are hereby incorporated herein by reference.

BACKGROUND

In three-dimensional integrated circuit (3DIC) formation processes, device dies may be bonded to a wafer. Typically, after the bonding of the dies onto the wafer, a molding compound is applied to encapsulate the device dies and the wafer. Solder bumps are formed on the wafer to electrically couple to the devices in the wafer. The electrical connection to the devices in the device dies and the devices in the wafer is achieved through Through-Silicon Vias (TSVs).

After the molding compound is applied, a die saw is performed to saw the wafer and the device dies into packages, wherein each of the packages may include one of the device dies and one of the chips in the wafer. The die saw is typically performed using a blade, which cuts through the scribe lines in the wafer. Since the wafer may include low-k dielectric materials, the mechanical stress applied by the blade may cause cracks. The cracks in the low-k dielectric materials may propagate to the chips in the wafer, resulting in the yield loss.

BRIEF DESCRIPTION OF THE DRAWINGS

For a more complete understanding of the embodiments, and the advantages thereof, reference is now made to the following descriptions taken in conjunction with the accompanying drawings, in which.

DETAILED DESCRIPTION OF ILLUSTRATIVE EMBODIMENTS

The making and using of the embodiments of the disclosure are discussed in detail below. It should be appreciated, however, that the embodiments provide many applicable inventive concepts that can be embodied in a wide variety of specific contexts. The specific embodiments discussed are illustrative, and do not limit the scope of the disclosure.

Chip-on-Wafer (CoW) packages and methods for forming the same are provided in accordance with exemplary embodiments. The intermediate stages of forming the CoW packages in accordance with embodiments are illustrated. The variations of the embodiments are discussed. Throughout the various views and illustrative embodiments, like reference numbers are used to designate like elements.

Figure 1:
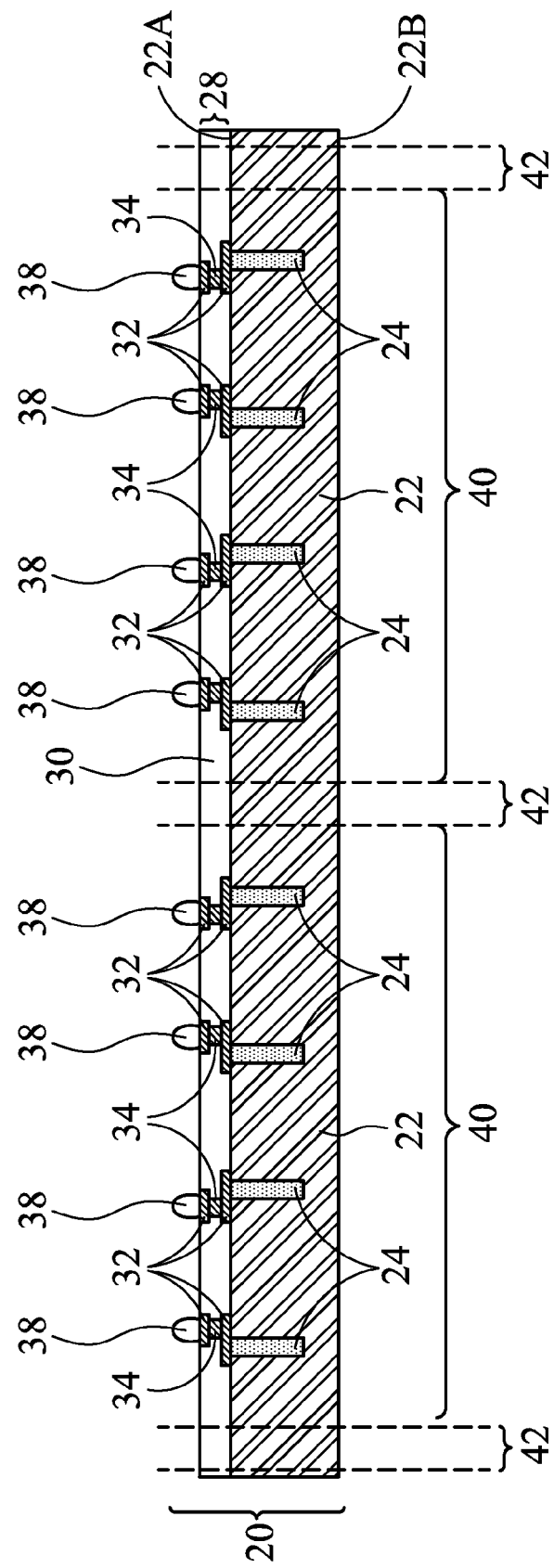
FIGS. 1 through 11B are cross-sectional views of intermediate stages in the manufacturing of a package in accordance with some exemplary embodiments.

FIGS. 1 through 11B are cross-sectional views of intermediate stages in the packaging of integrated circuits in accordance with some exemplary embodiments. FIG. 1 illustrates a cross-sectional view of package component 20, which may be a device wafer, an interposer wafer, or the like. Package component 20 includes substrate 22. In some embodiments, substrate 22 is a semiconductor substrate such as a crystalline silicon substrate. Alternatively, substrate 22 comprises other semiconductor materials such as silicon germanium, silicon carbon, or the like. In alternative embodiments, substrate 22 is a dielectric substrate. Package component 20 may be a device wafer, which includes active devices such as transistors (not shown) formed at surface 22A of semiconductor substrate 22. Throughout the description, surfaces 22A and 22B are referred to as a front surface and a back surface, respectively, of substrate 22. When package component 20 is a device wafer, it may also include passive devices (not shown) such as resistors and/or capacitors. In alternative embodiments, package component 20 is an interposer wafer that does not have active devices therein. In these embodiments, package component 20 may, or may not, include passive devices formed therein.

Through-Substrate Vias (TSVs) 24 may be formed to extend from top surface 22A of substrate 22 into substrate 22. TSVs 24 are also sometimes referred as through-silicon vias when substrate 22 is a silicon substrate. Package component 20 includes a plurality of package components 40, which may be identical to each other. A plurality of scribe lines 42 are located between neighboring package components 40. Package components 40 may be device dies (also known as chips), interposer dies/chips, or the like.

Interconnect structure 28 is formed over substrate 22, and is used to electrically connect to the integrated circuit devices in package component 20 and/or TSVs 24. Interconnect structure 28 may include a plurality of dielectric layers 30. Metal lines 32 are formed in dielectric layers 30. Vias 34 are formed between, and interconnecting, the overlying and underlying metal lines 32. Metal lines 32 and vias 34 are sometimes referred to as Redistribution Lines (RDLs) 32/34. In some embodiments, dielectric layers 30 comprise silicon oxide, silicon nitride, silicon carbide, silicon oxynitride, or combinations thereof. Alternatively, dielectric layers 30 may include one or more low-k dielectric layer having low k values. The k values of the low-k dielectric materials in dielectric layers 30 may be lower than about 3.0, or lower than about 2.5, for example.

Connectors 38 are formed at the top surface of package component 20. In some embodiments, connectors 38 include metal pillars, wherein solder caps may be, or may not be, formed on the top surfaces of the metal pillars. In alternative embodiments, connectors 38 comprise solder regions. In yet other embodiments, connectors 38 may be composite bumps including copper posts, nickel layers, solder caps, and/or the like.

Figure 2:
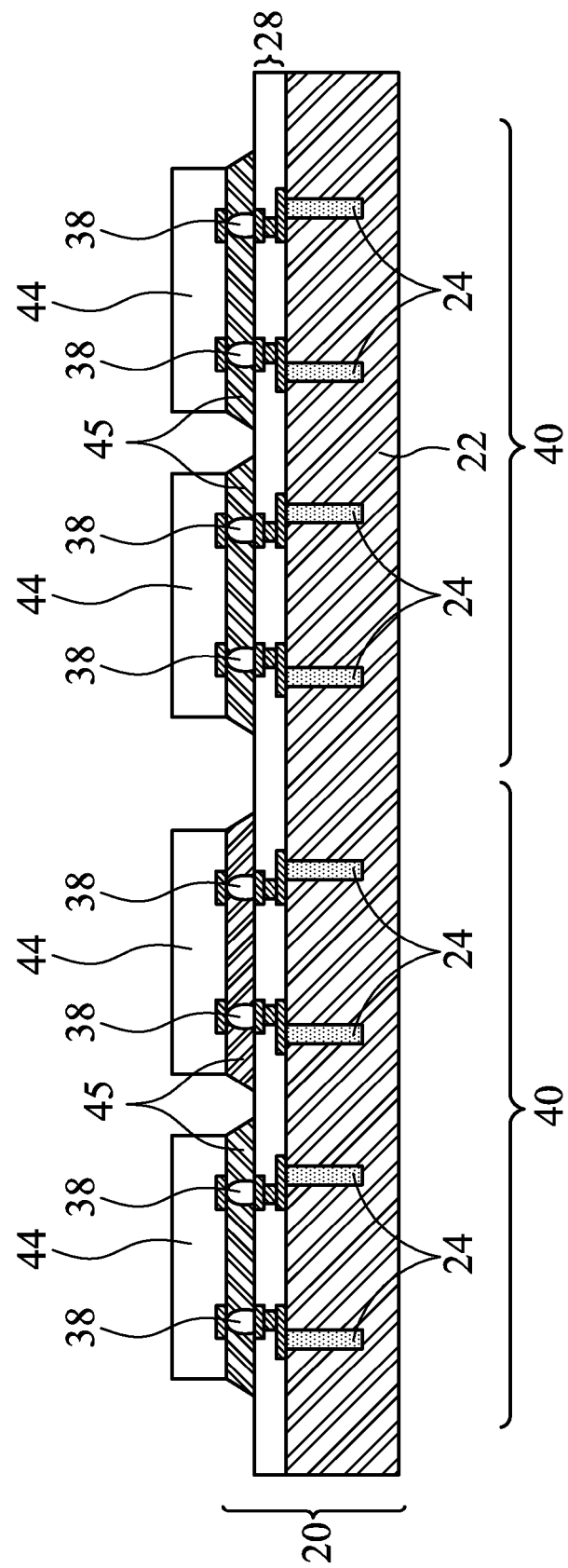

Referring to FIG. 2, package components 44 are bonded to package component 20, for example, through flip-chip bonding. Connectors 38 accordingly electrically couple the circuits in package components 44 to RDLs 32/34 and TSVs 24 in package component 20. Package components 44 may be device dies comprising logic circuits, memory circuits, or the like. Accordingly, package components 44 are alternatively referred to as dies 44 throughout the description. Alternatively, package components 44 may include packages including dies bonded to the respective interposers, package substrates, and/or the like. On each of chips 40, there may be two or more dies 44 bonded thereon.

Next, polymer 45 is dispensed into the space (gaps) between dies 44 and package component 20. Polymer 45 may be an underfill, and hence is referred to as underfill 45 hereinafter, although it may also comprise other polymers such as epoxy. Underfill 45 may also be a molding underfill.

Figure 3:
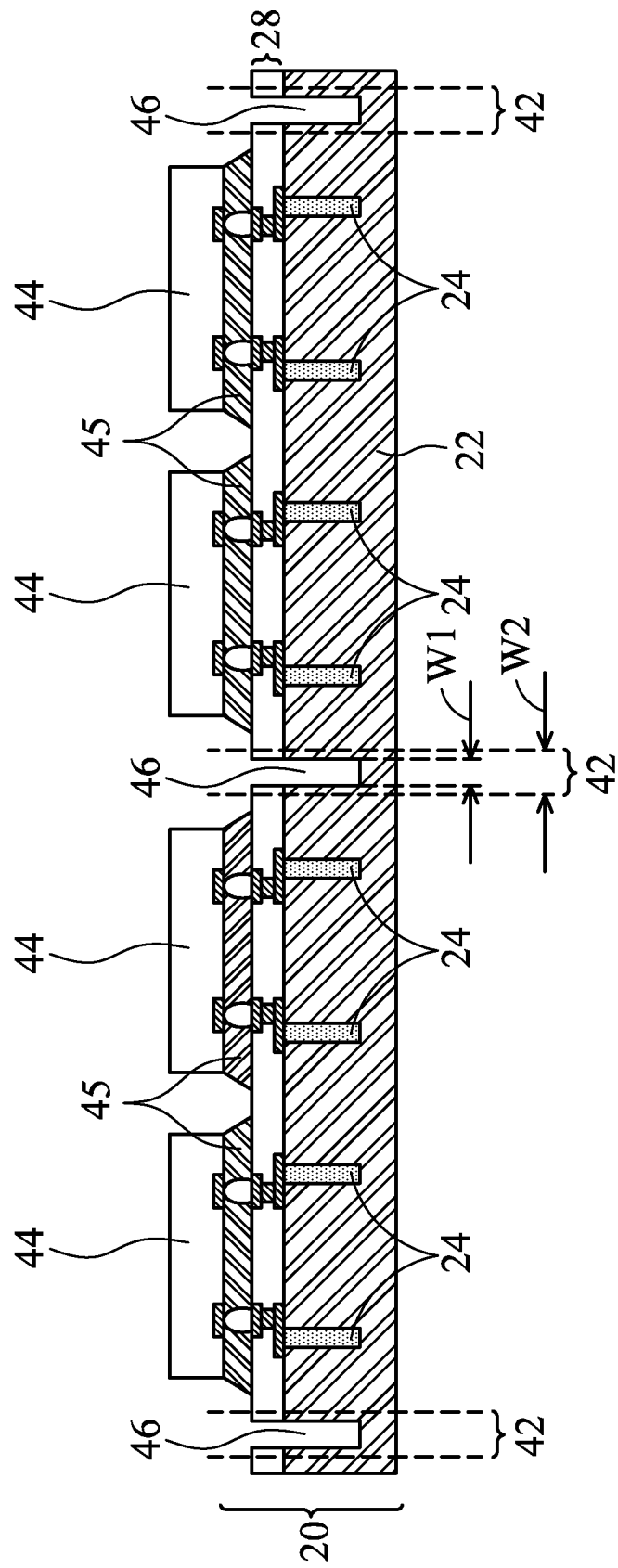

Referring to FIG. 3, a grooving step is performed on package component 20 to form trenches 46. Trenches 46 are located in scribe lines 42. The bottoms of trenches 46 may be substantially level with, or below, the bottom ends of TSVs 24. Width W1 of trenches 46 may be between about 10 μm and about 100 μm, for example. Width W1 of trenches 46 may also be smaller than or substantially equal to width W2 of scribe lines 42.

Figure 4:
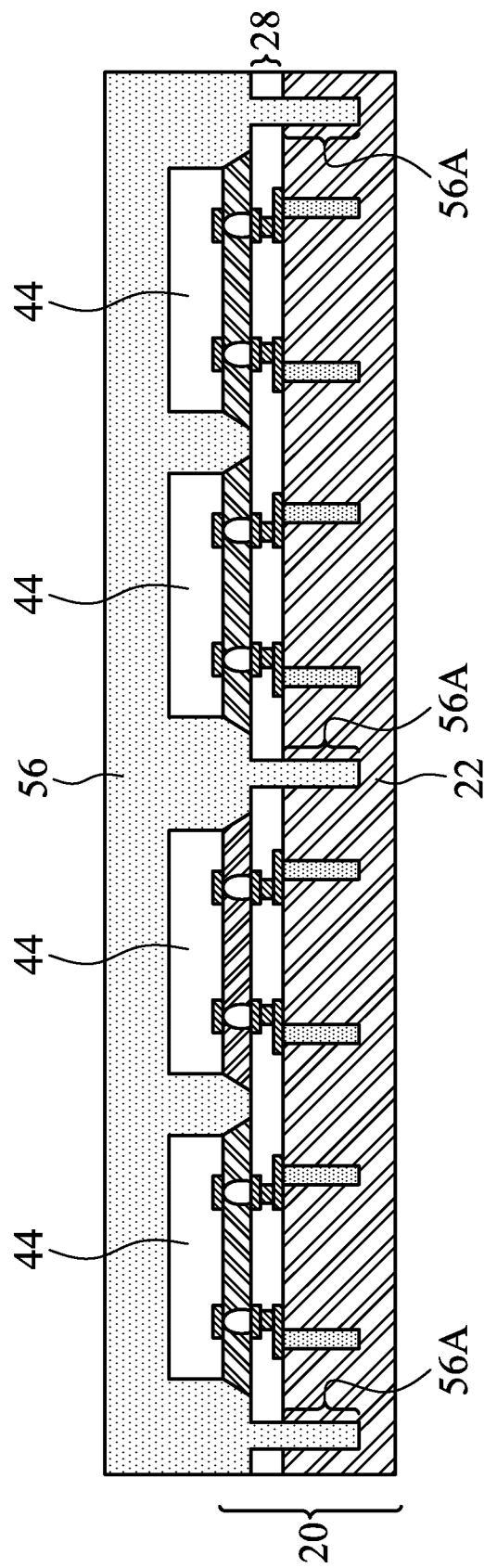
Figure 5:
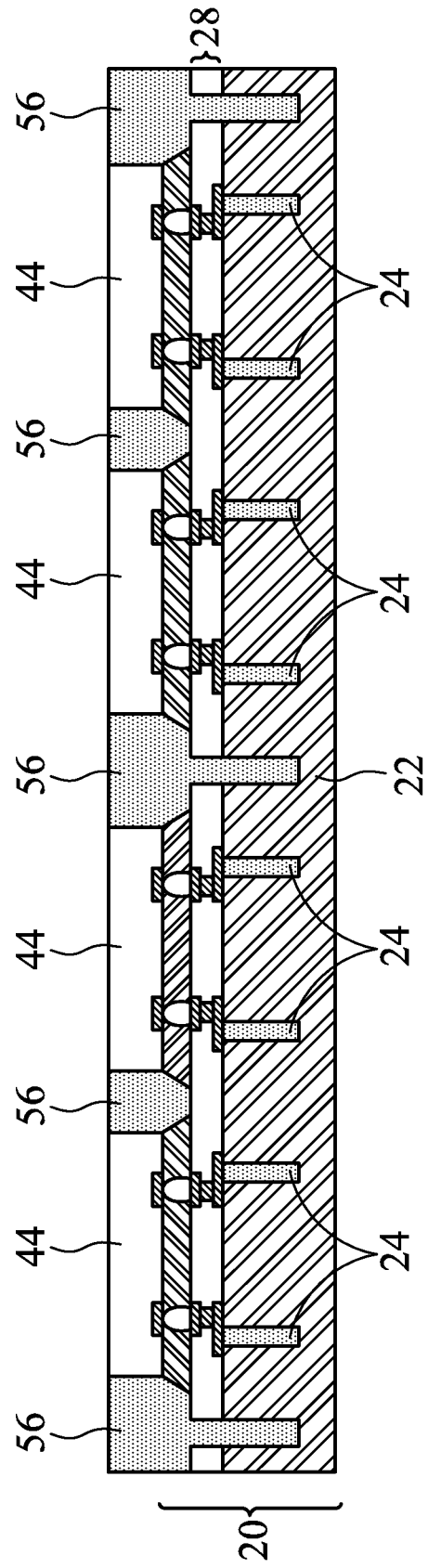
Figure 6:
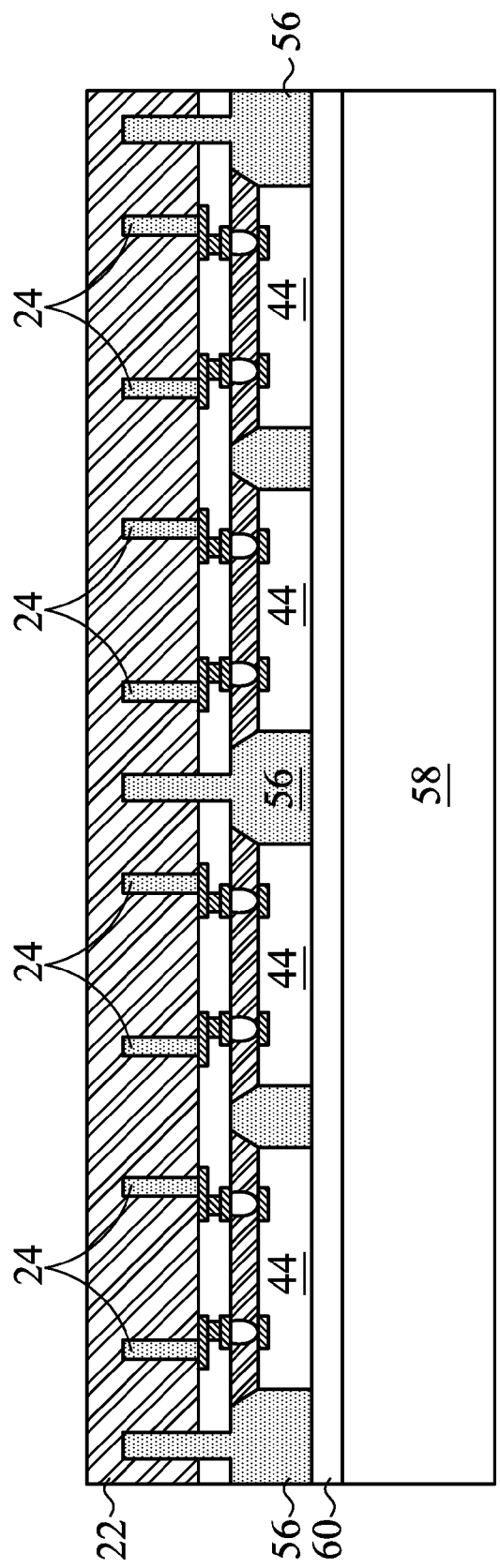

Next, as shown in FIG. 4, polymer 56 is molded on dies 44 and package component 20, for example, using compress molding. In some embodiments, polymer 56 comprises a molding compound, an epoxy, or the like. Polymer 56 may comprise first portions filling into trenches 46 and extending into substrate 22, second portions filling the gaps between neighboring dies 44, and third portions over dies 44. Polymer 56 is then cured. Referring to FIG. 5, in some embodiments, after the curing of polymer 56, a planarization step, such as a grinding step, is performed to level the top surface of polymer 56. The portions of polymer 56 over dies 44 are removed. As a result, the top surfaces of some or all dies 44 are exposed. In alternative embodiments, no planarization step is performed.

FIGS. 6 through 10 illustrate the formation of the backside structure of package component 20. The package structure shown in FIG. 5 is first flipped upside down, and semiconductor substrate 22 faces upwardly. Carrier 58 is then attached to the bottom of the package structure, for example, through adhesive 60. In some exemplary embodiments, carrier 58 is a glass wafer. Adhesive 60 may be an Ultra-Violet (UV) glue in some exemplary embodiments.

Figure 7A:
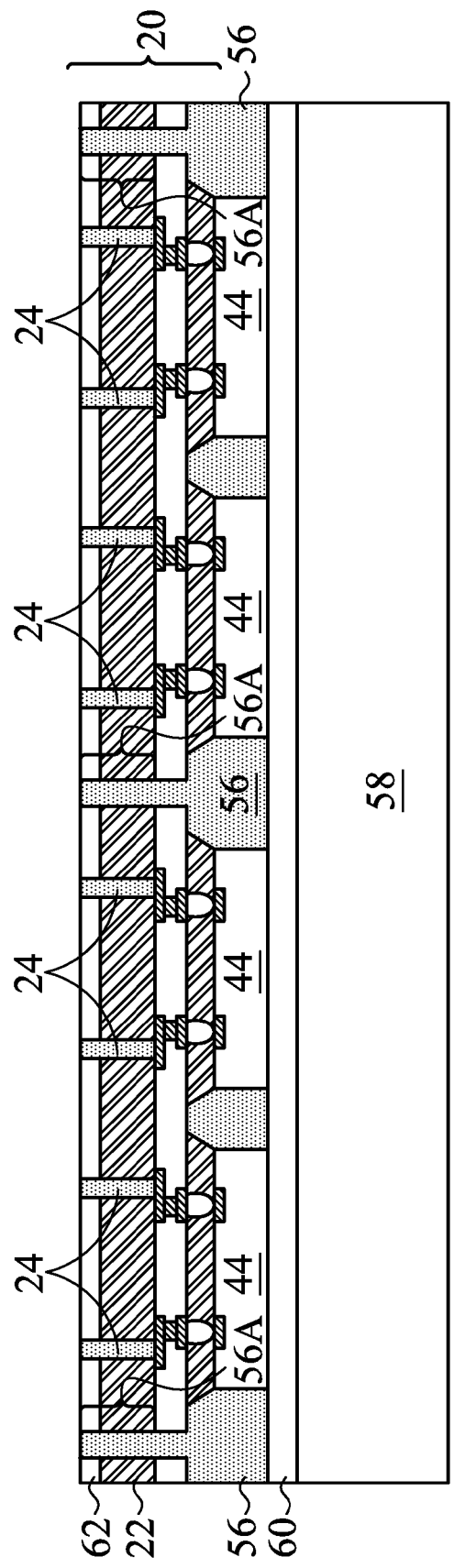
Figure 7B:
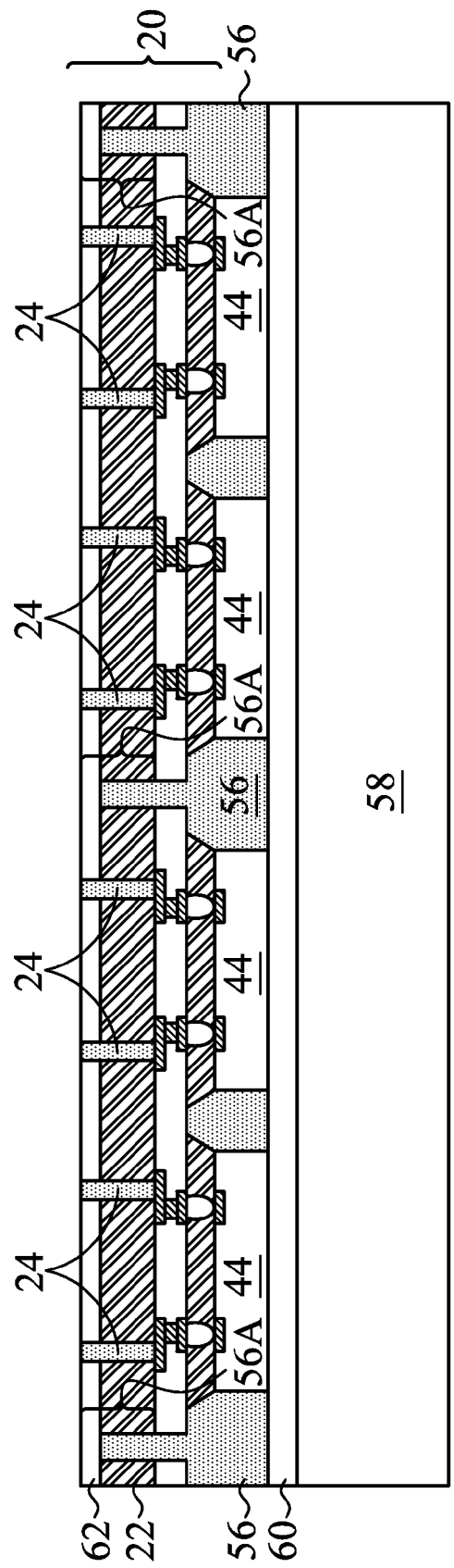

Referring to FIGS. 7A and 7B, a backside grinding is performed on the backside of semiconductor substrate 22 to thin semiconductor substrate 22, until TSVs 24 are exposed. Insulation layer (or insulation layers) 62 is then formed on the backside of semiconductor substrate 22, wherein TSVs 24 extend through insulation layer 62. Insulation layer 62 is formed after thinning semiconductor substrate 22, and a Chemical Mechanical Polish (CMP) process is performed to expose TSVs 24. Insulation layer 62 also acts as an isolation layer to isolate semiconductor substrate 22. The materials of insulation layer 62 may include silicon oxide, silicon nitride, or the like. The formation process for forming insulation layer 62 may include low-temperature deposition processes. In some embodiments, as shown in FIG. 7A, after the formation of insulation layer 62, polymer portions 56A are exposed through insulation layer 62. Alternatively, as shown in FIG. 7B, insulation layer 62 covers polymer portions 56A.

Figure 8:
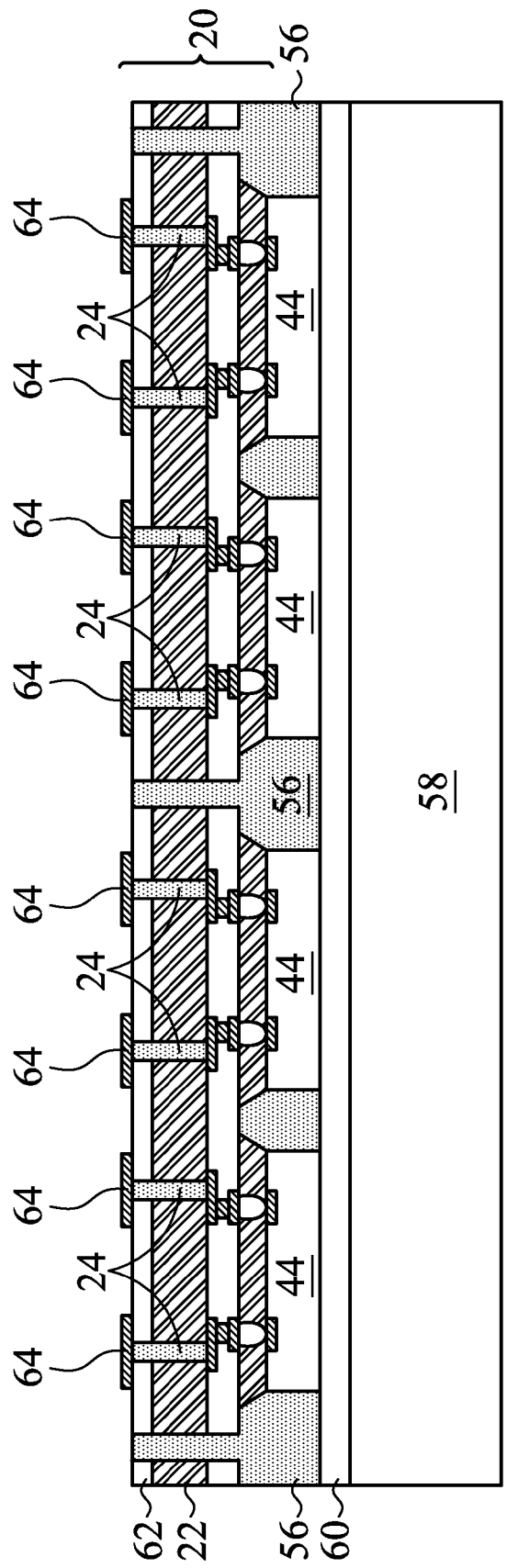

Refer to FIG. 8, conductive features 64 are formed over insulation layer 62 and connected to TSVs 24. Conductive features 64 include Redistribution Lines (RDLs) and conductive pads. In some embodiments, conductive features 64 comprise aluminum, copper, and/or the like. In accordance with some embodiments, the formation of conductive features 64 includes forming a blanket layer, and patterning the blanket layer.

Figure 9:
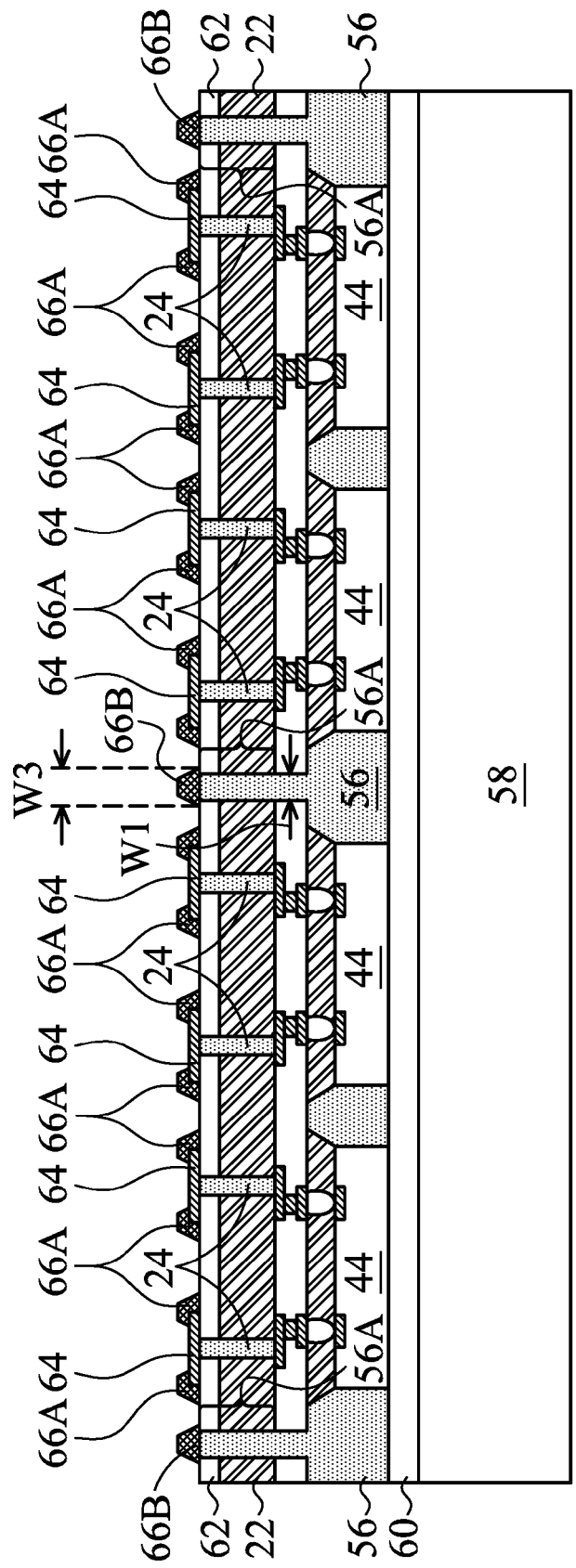

Next, as shown in FIG. 9, dielectric patterns 66A and 66B are formed. Dielectric patterns 66A and 66B may include a polymer such as epoxy, polyimide, benzocyclobutene (BCB), polybenzoxazole (PBO), and the like. Dielectric patterns 66A and 66B may also include photo-sensitive materials (such as PBO or polyimide). Accordingly, the formation of dielectric patterns 66A and 66B may include applying a blanket photo-sensitive material, and exposing and developing the photo-sensitive material. The materials of dielectric patterns 66A and 66B may be relatively soft for absorbing stress. Alternatively, other dielectric materials such as oxides, nitrides, combinations thereof, and multi-layers thereof, may also be used for forming dielectric patterns 66A and 66B. The respective formation process includes low-temperature deposition process(es), so that adhesive 58 is not damaged.

Dielectric patterns 66A may have ring shapes in the top view of the structure shown in FIG. 9. Dielectric patterns 66B include portions that are over and aligned to polymer portions 56A. Furthermore, dielectric patterns 66B may have width W3 greater than width W1 of polymer portions 56A, and may extend beyond the respective edges of polymer portions 56A. Accordingly, dielectric patterns 66B may cover entireties of polymer portions 56A. In the embodiments wherein polymer portions 56A penetrate through insulation layer 62, dielectric patterns 66B are in contact with polymer portions 56A. In alternative embodiments wherein polymer portions 56A are covered by insulation layer 62 (FIG. 7B), dielectric patterns 66B are spaced apart from polymer portions 56A by insulation layer 62. An exemplary top view of dielectric patterns 66A and 66B are illustrated in FIG. 12.

Figure 10:
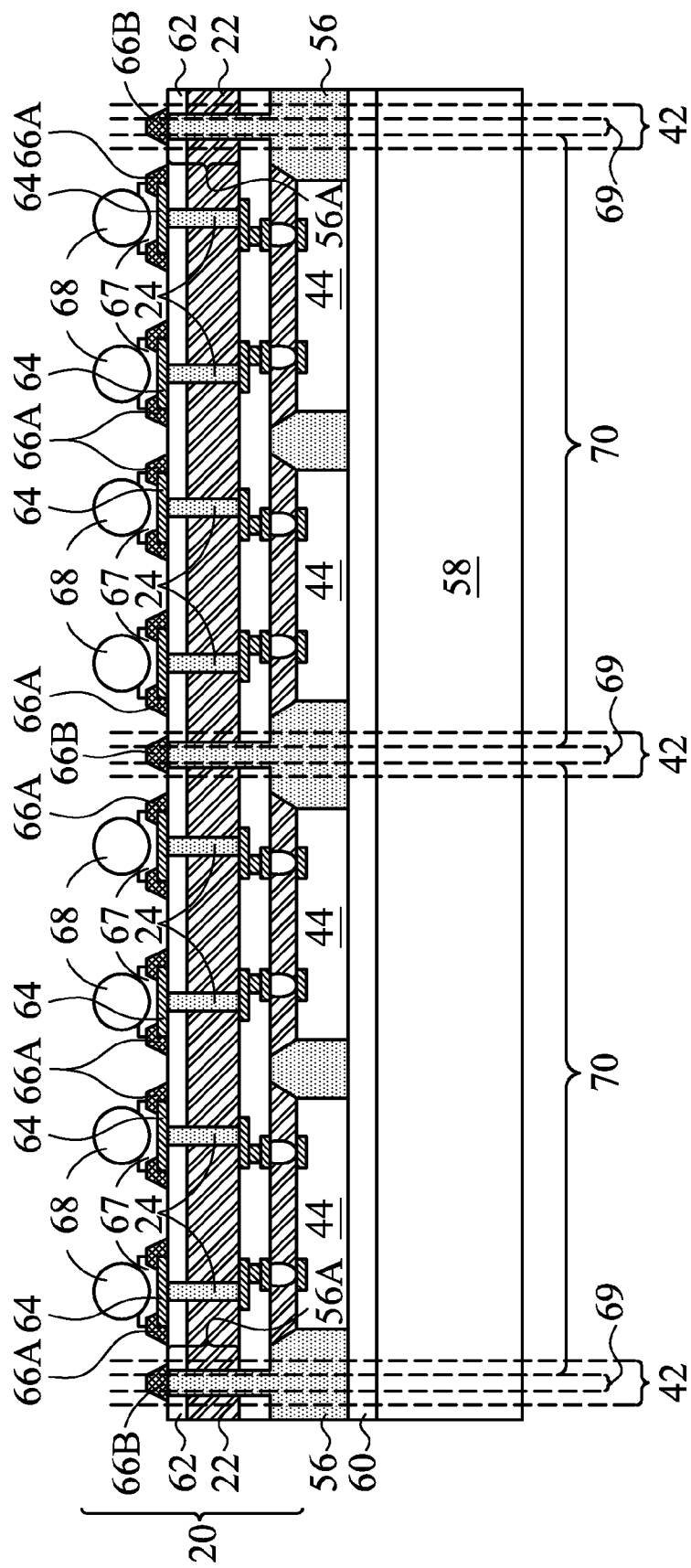

FIG. 10 illustrates the formation of connectors 68, which are electrically coupled to TSVs 24 through the exposed portions of conductive features 64. In some embodiments, connectors 68 are solder balls. In other embodiments, connectors 68 may comprise metal pads, metal bumps, solder caps, or the like. The exemplary formation process may include blanket forming a blanket under-bump-metallurgy (UBM) layer (not shown) using Physical Vapor Deposition (PVD), forming a mask (not shown), wherein the portion of the UBM layer directly over the exposed portions of conductive features 64 are exposed through the mask, while some other portions of the UBM are covered. Connectors 68 are then plated into the openings in the mask. The mask is then removed, and a flash etch is performed to remove the exposed portions of the UBM layer not covered by connectors 68. The remaining portions of the UBM layer are referred to as UBMs 67. In the embodiments wherein connectors 68 comprise solder, a reflow may be performed after the plating. Connectors 68 may be used to bond to an additional electrical component (not shown), which may be a package substrate, a printed circuit board (PCB), or the like.

Figure 11A:
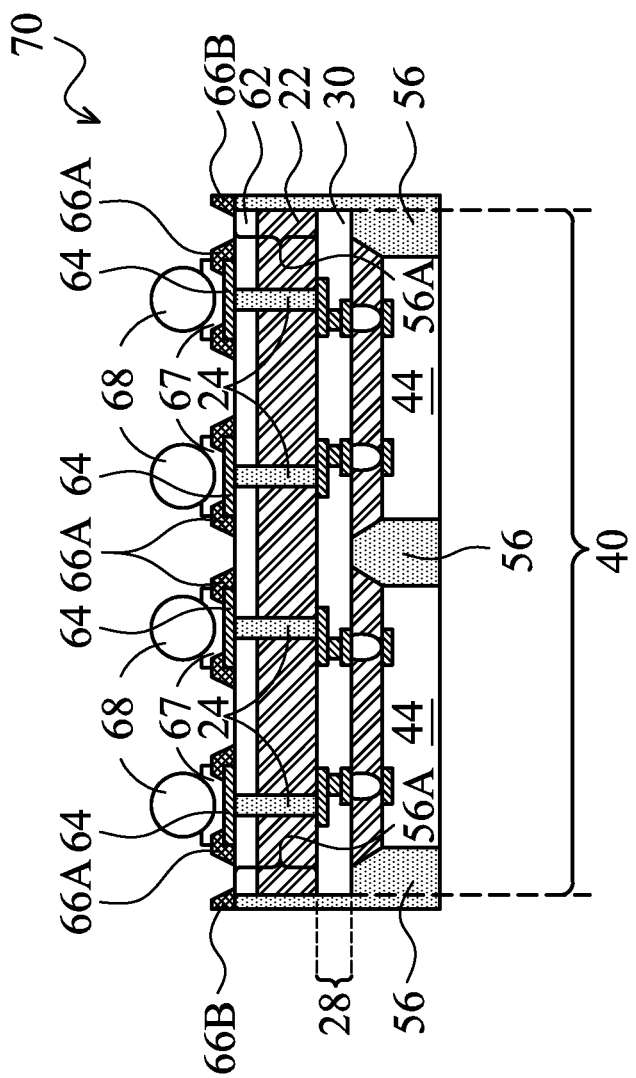
Figure 11B:
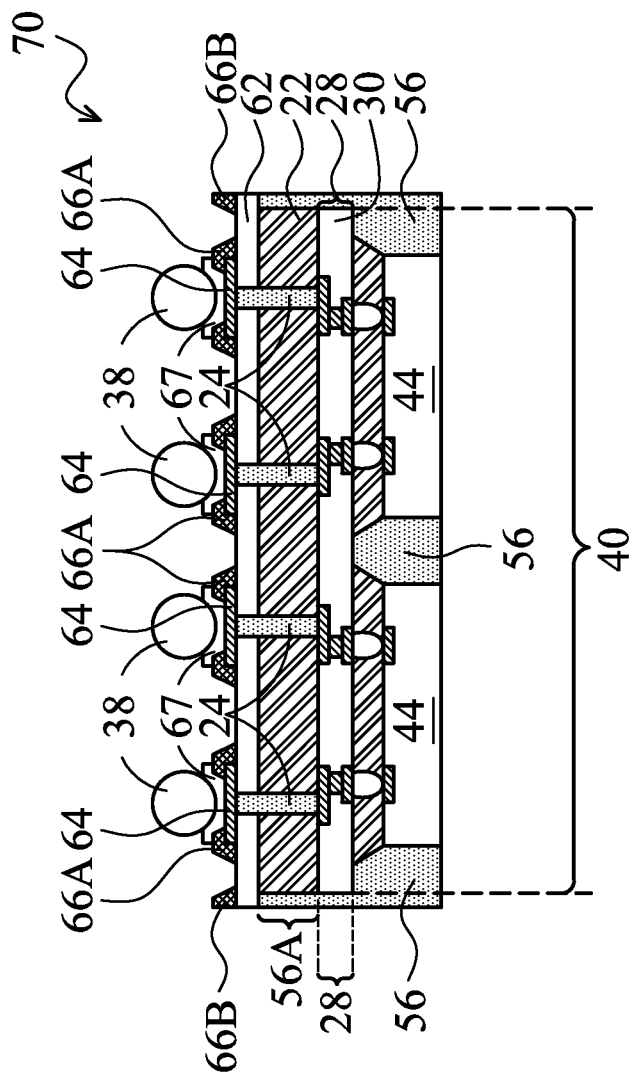

A die sawing is then performed to saw apart packages 70 from the package structure shown in FIG. 10. The sawing is performed along scribe lines 42. The kerf lines 69 may be in the middle of polymer portions 56A (FIG. 10). The resulting packages 70 are shown in FIGS. 11A and 11B. Each of packages 70 includes one of dies 40 and one or more of dies 44. After the sawing, as shown in FIGS. 11A and 11B, some polymer portions 56A remain on the sidewalls of substrate 22 and the sidewalls of dielectric layers 30. Dielectric patterns 66B also have remaining portions over and aligned to polymer portions 56A, wherein the outer edges of dielectric patterns 66B are aligned to the corresponding outer edges of polymer portions 56A. In FIG. 11A, dielectric patterns 66B contact the top surfaces of polymer portions 56A. In FIG. 11B, dielectric patterns 66B are spaced from polymer portions 56A by insulation layer 62.

Figure 12:
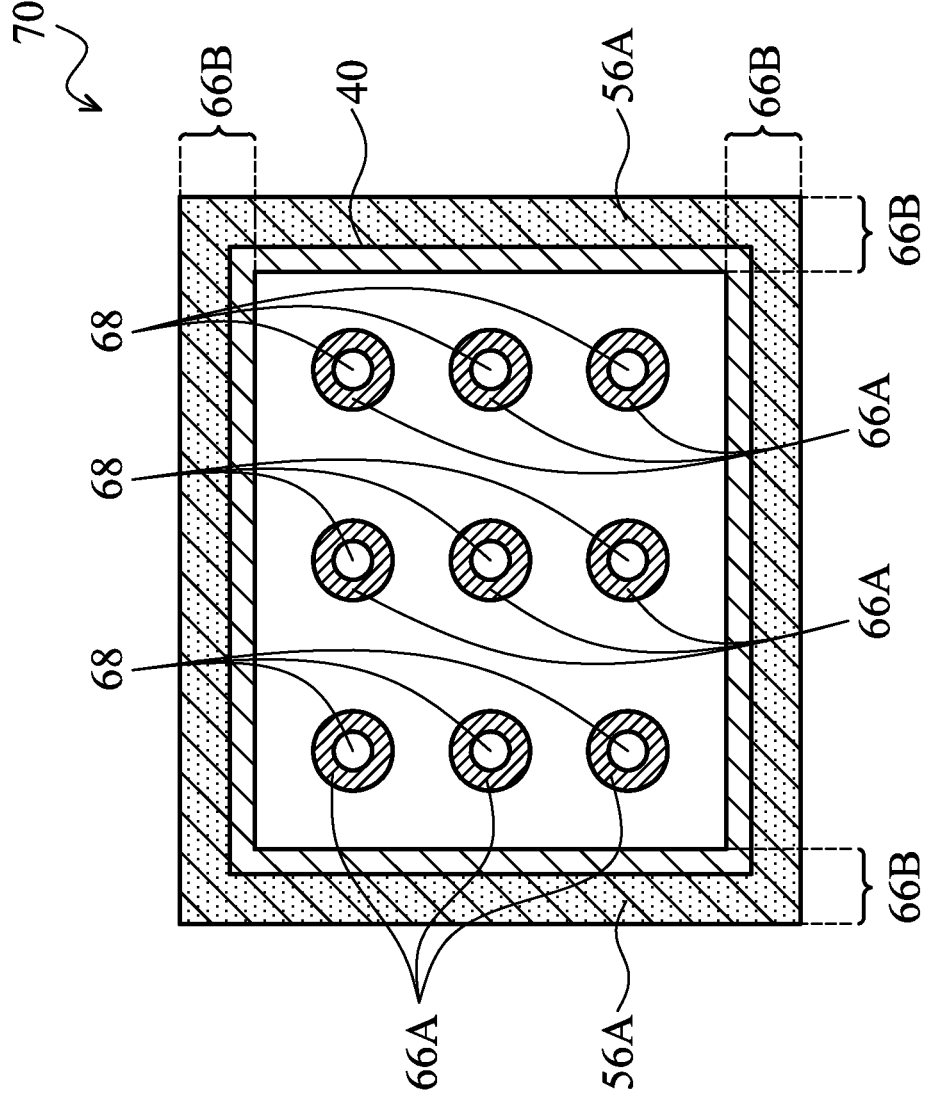
FIG. 12 illustrates a top view of a package formed using the process in FIGS. 1 through 11B.

FIG. 12 illustrates a top view of package 70. Dielectric pattern 66B forms a ring that extends to the edges of package 70. The edges of dielectric pattern 66B are aligned to the edges of polymer portion 56A, which also forms a ring encircling and contacting chip 40 (please refer to FIG. 1). Dielectric pattern 66B, in addition to covering the entirety of polymer portion 56A, may also extend slightly beyond polymer portion 56A in the direction toward the center of package 70. Dielectric patterns 66A may form a plurality of rings that is separated from each other, and separated from dielectric pattern 66B. Each of dielectric patterns 66A may form a ring covering edge portions of the respective underlying conductive features 64.

In the embodiments, dielectric pattern 66B (FIG. 10) covers polymer portions 56A. Accordingly, in the packaging process, for example, in the deposition process for forming UBM 67 as in FIG. 10, dielectric patterns 66B prevents the out-gassing from polymer portion 56A. The undesirable re-deposition during the formation of UBMs 67 is thus reduced.

In accordance with embodiments, a package component includes a substrate, wherein the substrate has a front surface and a back surface over the front surface. A through-via penetrates through the substrate. A conductive feature is disposed over the back surface of the substrate and electrically coupled to the through-via. A first dielectric pattern forms a ring covering edge portions of the conductive feature. A Under-Bump-Metallurgy (UBM) is disposed over and in contact with a center portion of the conductive feature. A polymer contacts a sidewall of the substrate. A second dielectric pattern is disposed over and aligned to the polymer. The first and the second dielectric patterns are formed of a same dielectric material, and are disposed at substantially a same level.

In accordance with other embodiments, a wafer includes a plurality of chips including a plurality of through-substrate vias penetrating through a semiconductor substrate of the wafer, and a plurality of scribe lines separating the plurality of chips from each other. A plurality of dies is underlying and bonded to a front side of the wafer. A first polymer region includes first portions in the plurality of scribe lines, wherein the first portions penetrate through the wafer and contact sidewalls of the semiconductor substrate. The first polymer region further includes second portions at a same level as, and encircling, the plurality of dies. A plurality of conductive features is disposed on a back side of the semiconductor substrate and electrically coupled to the plurality of through-substrate vias. A second polymer layer includes first portions covering edge portions of the plurality conductive features, and second portions over and aligned to the first portions of the first polymer region.

In accordance with yet other embodiments, a method includes forming trenches in scribe lines of a wafer, wherein the trenches extend from a front surface of the wafer into a substrate of the wafer. A first polymer is filled into the trenches. The substrate is thinned from the backside, wherein the first polymer and through-vias in the substrate are exposed after the step of thinning Conductive features are formed on the backside of the wafer and electrically coupled to the through-vias. A second polymer layer is formed on the backside of the wafer and covering the conductive features. The second polymer layer is then patterned. The remaining portions of the patterned second polymer layer include first portions covering edge portions of the conductive features, and second portions aligned to portions of the first polymer in the trenches.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A method comprising:
    bonding a plurality of dies onto chips of a wafer;
    forming trenches in scribe lines of the wafer, wherein the trenches extend from a front surface of the wafer into a semiconductor substrate of the wafer;
    molding the plurality of dies with a first dielectric material, wherein the first dielectric material is filled into the trenches;
    thinning the substrate from a backside of the wafer, wherein through-vias in the semiconductor substrate are exposed after the thinning; and
    forming conductive features on the backside of the wafer, wherein the conductive features are electrically coupled to the through-vias.

2. The method of claim 1 further comprising:
    forming a second dielectric material on the backside of the wafer and covering the conductive features; and
    patterning the second dielectric material, wherein remaining portions of the second dielectric material comprise:
        first portions covering edge portions of the conductive features, with center portions of the conductive features not covered by the second dielectric material; and
        second portions aligned to portions of the first dielectric material in the trenches.

3. The method of claim 2, wherein the second dielectric material comprises a photo-sensitive material.

4. The method of claim 1 further comprising, performing a die saw on the wafer to form a package, wherein in the package, a portion of the first dielectric material forms a first ring encircling one of the chips.

5. The method of claim 4, wherein in the package, the ring encircles, and is in contact with, the semiconductor substrate.

6. The method of claim 1, wherein after the thinning the semiconductor substrate, portions of the first dielectric material in the trenches are exposed.

7. The method of claim 1, wherein the first dielectric material comprises a molding compound.

8. A method comprising:
    forming trenches in scribe lines of a wafer, wherein the trenches extend from a front surface of the wafer into a substrate of the wafer;
    filling a first polymer into the trenches;
    thinning the substrate from a backside of the wafer, wherein the first polymer and through-vias in the substrate are exposed after the thinning;
    forming conductive features on the backside of the wafer, wherein the conductive features are electrically coupled to the through-vias;
    forming a second polymer layer on the backside of the wafer and covering the conductive features; and
    patterning the second polymer layer, wherein remaining portions of the second polymer layer comprise first portions covering edge portions of the conductive features, and second portions aligned to portions of the first polymer in the trenches.

9. The method of claim 8, wherein the first portions of the second polymer layer form a plurality of rings disconnected from each other, and wherein the plurality of rings is disconnected from the second portions of the second polymer layer.

10. The method of claim 8 further comprising:
    forming Under-Bump-Metallurgies (UBMs) encircled by the first portions of the second polymer layer, wherein the UBMs are coupled to respective underlying ones of the conductive features; and forming connectors over and aligned to the UBMs.

11. The method of claim 8 further comprising, after the patterning the second polymer layer, performing a die saw on the wafer to form a package, wherein in the package, a portion of the first polymer forms a first ring encircling a chip of the wafer, and the second portions of the second polymer layer form a second ring, and wherein respective outer edges of the first ring and the second ring are aligned to each other.

12. The method of claim 11, wherein the outer edges of the first ring and the second ring are aligned to respective edges of the package.

13. The method of claim 8 further comprising, before the step of filling the first polymer into the trenches, bonding a die onto the wafer, wherein the first polymer further encapsulates the die.

14. The method of claim 8, wherein the first polymer comprises a molding compound, and the second polymer layer comprises a photo-sensitive material.

15. A method comprising:

bonding a plurality of dies onto chips of a wafer;

forming trenches in scribe lines of the wafer, wherein the trenches extend from a front surface of the wafer into a substrate of the wafer;

filling a first dielectric material into the trenches;

thinning the substrate from a backside of the wafer, wherein the first dielectric material and through-vias in the substrate are exposed after the thinning;

forming conductive features on the backside of the wafer, wherein the conductive features are electrically coupled to the through-vias;

covering edge portions of the conductive features and portions of the first dielectric material in the trenches with a second dielectric material; and forming electrical connectors electrically connected to the conductive features.

16. The method of claim 15, wherein center portions of the conductive features are exposed through the second dielectric material.

17. The method of claim 16 further comprising:

forming Under-Bump-Metallurgies (UBMs) coupled to respective underlying ones of the conductive features, wherein the connectors are electrically coupled to the UBMs.

18. The method of claim 15 further comprising molding the plurality of dies using the first dielectric material, wherein the trenches are filled during the molding.

19. The method of claim 15 further comprising, performing a die saw on the wafer to form a package, wherein in the package, a portion of the first dielectric material in the trenches forms a first ring encircling a chip of the wafer.

20. The method of claim 19, wherein in the package, the second dielectric material forms a second ring, and wherein respective outer edges of the first ring and the second ring are aligned to each other.

* * * * *